(12) United States Patent
Shim

(10) Patent No.: US 7,595,210 B2
(45) Date of Patent: Sep. 29, 2009

(54) METHOD OF MANUFACTURING COMPLEMENTARY METAL OXIDE SEMICONDUCTOR IMAGE SENSOR

(75) Inventor: Hee Sung Shim, Gangneung-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 309 days.

(21) Appl. No.: 11/612,619

(22) Filed: Dec. 19, 2006

(65) Prior Publication Data

US 2007/0155038 A1 Jul. 5, 2007

(30) Foreign Application Priority Data

Dec. 29, 2005 (KR) .................. 10-2005-0134174

(51) Int. Cl.
 *H01L 21/00* (2006.01)
(52) U.S. Cl. .................... 438/57; 438/60; 438/199; 257/E27.132; 257/E27.133
(58) Field of Classification Search .............. 438/48, 438/57, 59, 60, 6, 75, 199; 257/251, 269, 257/283, 290, 431, 443, E27.132, E27.133
See application file for complete search history.

(56) References Cited

U.S. PATENT DOCUMENTS 6,218,691 B1 * 4/2001 Chung et al. ............ 257/290
6,380,568 B1 * 4/2002 Lee et al. ................. 257/251
2005/0051701 A1 3/2005 Hong
2005/0250240 A1 11/2005 Hong et al.

FOREIGN PATENT DOCUMENTS

KR 10-2001-0082654 6/2003

OTHER PUBLICATIONS

Office Action dated Jun. 6, 2008 in Chinese Application No. 200610171258.3, filed Dec. 25, 2006.

* cited by examiner

*Primary Examiner*—Brook Kebede
(74) *Attorney, Agent, or Firm*—Saliwanchik, Lloyd & Saliwanchik

(57) ABSTRACT

A method of manufacturing a complementary metal oxide semiconductor (CMOS) image sensor is provided. The method can include the steps of: providing a semiconductor substrate having an active region and an isolation region defined thereon; forming a photodiode at a photodiode area of the active region; forming first and second gate polys on a transistor region of the active region; forming a floating diffusion region on the semiconductor substrate between the first and second gate polys for receiving electrons transferred from the photodiode; and forming a floating diffusion node region at a part of the floating diffusion region for forming a metal contact. The floating diffusion region can be formed independently of the floating diffusion node region, so that a junction leakage current generated from the floating diffusion node region can be controlled.

7 Claims, 3 Drawing Sheets

METHOD OF MANUFACTURING COMPLEMENTARY METAL OXIDE SEMICONDUCTOR IMAGE SENSOR

RELATED APPLICATION(S)

This application claims priority under 35 U.S.C. §119(e) of Korean Patent Application No. 10-2005-0134174 filed Dec. 29, 2005, which is incorporated herein by reference in its entirety.

FIELD OF THE INVENTION

The present invention relates to a method of manufacturing an image sensor. Particularly, the present invention relates to a method of forming a floating diffusion node region of a complementary metal oxide semiconductor (CMOS) image sensor.

BACKGROUND OF THE INVENTION

In general, image sensors are semiconductor devices for converting optical images into electric signals, and are generally classified as charge coupled device (CCD) image sensors or complementary metal oxide semiconductor (CMOS) image sensors.

CCDs require high power consumption and many complicated manufacturing processes and are difficult to be made in a single chip.

For this reason, the CMOS image sensor has recently been spotlighted.

The CMOS sensor includes a photodiode (PD) and a metal oxide semiconductor (MOS) transistor in each unit pixel and sequentially detects the electric signals of each unit pixel through the MOS transistor in a switching mode to realize images.

Since the CMOS image sensor employs a CMOS manufacturing technology, it requires low power consumption and only about twenty masks in a manufacturing process. Accordingly, the manufacturing process of the CMOS image sensor is typically more desirable.

In addition, since the CMOS image sensor can be realized in a single chip together with various signal processing circuits, it has attracted considerable attention as a next generation image sensor.

The conventional CMOS image sensor will now be described with reference to the accompanying drawings.

FIG. 1 is an equivalent circuit diagram illustrating a 4T-type CMOS image sensor including one photodiode and four transistors. FIG. 2 is layout view showing a unit pixel of a conventional 4T-type CMOS image sensor.

As illustrated in FIGS. 1 and 2, the unit pixel of the 4T-type CMOS image sensor includes a photodiode PD (10) serving as a photoelectric conversion portion and four transistors Tx, Rx, Dx, and Sx.

The four transistors are transfer, reset, drive and selection transistors Tx (20), Rx (30), Dx (40) and Sx (50), respectively. Also, a load transistor is connected electrically to a drain terminal of the selection transistor, which is an output terminal of each unit pixel.

FIG. 3 is a sectional view illustrating the conventional 4T type CMOS image sensor.

As seen in FIG. 3, the conventional 4T-type CMOS image sensor includes a P− type semiconductor substrate 1 on which an active region and an isolation region are defined, an isolation layer 5 formed in the isolation region, and a well region formed on the surface of the semiconductor substrate 1. The conventional 4T-type CMOS image sensor also has gate insulating layers (not shown), gate electrodes 20 and 30, and spacers 125 formed at both sides the gate insulating layers and the gate electrodes. In addition, an N− type lightly doped drain region (not shown) is formed on the surface of the semiconductor substrate 1 below the spacers 125.

An N+ type well region is formed on the surface of the semiconductor substrate 1 at both sides of the gate electrodes 20, 30, 40, 50, and serves as a source/drain region of each transistor. A floating diffusion node region 60 is the N+ type well region formed between the transfer transistor Tx and the reset transistor Rx.

However, the conventional CMOS image sensor has the following problems.

According to the method of manufacturing the conventional CMOS image sensor, the floating diffusion node region is generally open in a mask for forming a junction region of a logic section after forming a photodiode. As a reference, the junction region of the logic section refers to a floating diffusion region, which is described herein.

For this reason, in the method of manufacturing the conventional CMOS image sensor, during ion implantation for forming the junction region of the logic section, the ions are implanted into the floating diffusion node region. This makes it difficult to independently adjust a capacitance value of the floating diffusion (FD) region.

In addition, since one mask is conventionally used, a process for reducing junction leakage of the floating diffusion node region is needed.

BRIEF SUMMARY

Accordingly, embodiments of the present invention are directed to a method of manufacturing a complementary metal oxide semiconductor (CMOS) image sensor, in which a mask forming a junction region of a logic section is formed independently of a mask for forming a floating diffusion node region of a unit pixel.

In order to accomplish this object, according to a first embodiment of the present invention, a method of manufacturing a complementary metal oxide semiconductor (CMOS) image sensor includes the steps of: preparing a semiconductor substrate formed with an isolation layer, forming a photodiode at a predetermined portion of the semiconductor substrate, forming first and second gate polys that are spaced apart from the photodiode at a predetermined interval on the semiconductor substrate, forming a floating diffusion region on the semiconductor substrate between the first and second gate polys so as to receive electrons transferred from the photodiode, and forming a floating diffusion node region at part of the floating diffusion region for a metal contact.

In an embodiment, the first gate poly is a gate poly of a transfer transistor of the CMOS image sensor, and the second gate poly is a gate poly of a reset transistor of the CMOS image sensor.

In an embodiment, the floating diffusion region can be formed by implanting n type impurity ions into the substrate.

The method can further include the step of implanting p type impurity ions into a surface of the floating diffusion region after implanting the n type impurity ions.

In a preferred embodiment, impurities implanted into the floating diffusion node region can be n+ type impurities, which are formed to a density higher than that of impurities implanted into the floating diffusion region.

According to a second embodiment of the present invention, a method of manufacturing a complementary metal oxide semiconductor (CMOS) image sensor includes the steps of: preparing a semiconductor substrate formed with an isolation region and an active region, forming a plurality of gate polys at a predetermined portion of the active region, forming a photodiode on the semiconductor substrate on one side of one of the plurality of gate polys, forming spacers on sidewalls of the gate polys, implanting $n^0$ type impurity ions to define a floating diffusion region in the active region using a first mask isolating the photodiode and opening a region between the gate polys, implanting $p^0$ type impurity ions into a surface of the floating diffusion region using the first mask, and implanting n+ type impurity ions to form the floating diffusion node region for a metal contact at part of the floating diffusion region using a second mask opening only part of the floating diffusion region.

DETAILED DESCRIPTION OF THE PREFERRED EMBODIMENTS

Hereinafter, a complementary metal oxide semiconductor (CMOS) image sensor and a method of manufacturing the same according to preferred embodiments of the present invention will be described with reference to the accompanying drawings.

Figure 1:
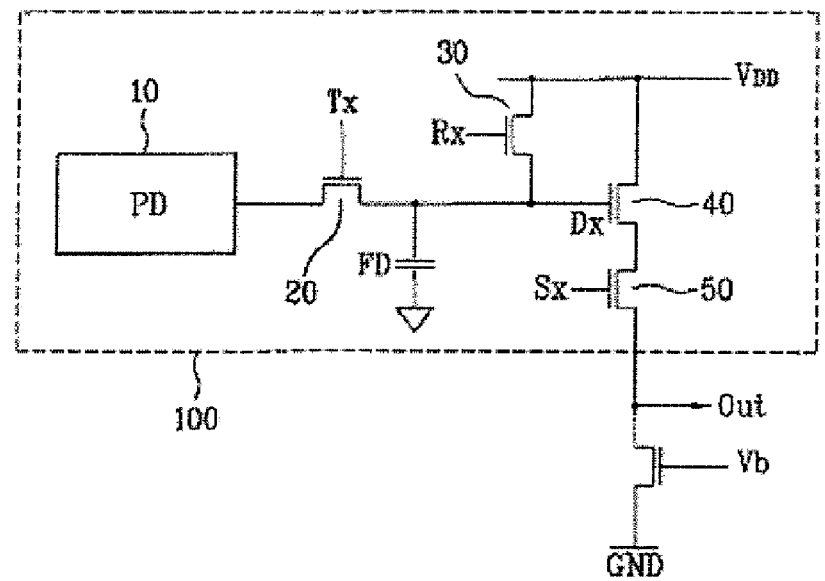
FIG. 1 is an equivalent circuit diagram illustrating a 4T-type complementary metal oxide semiconductor (CMOS) image sensor including one photodiode and four transistors.
Figure 2:
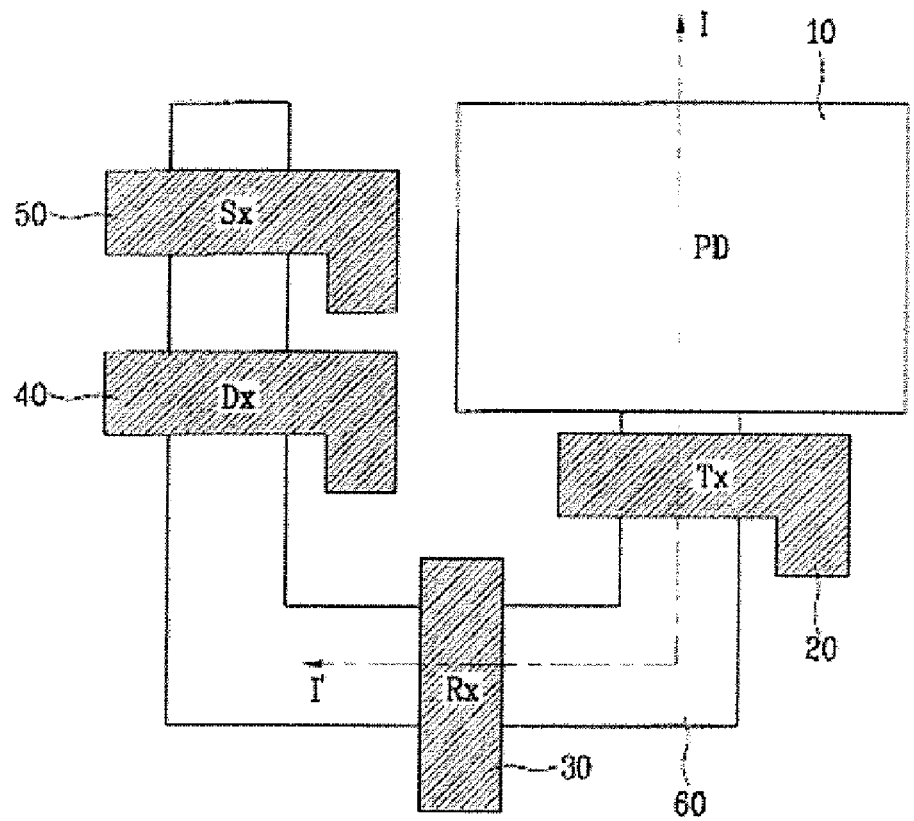
FIG. 2 is layout view showing a unit pixel of a conventional 4T-type CMOS image sensor.
Figure 3:
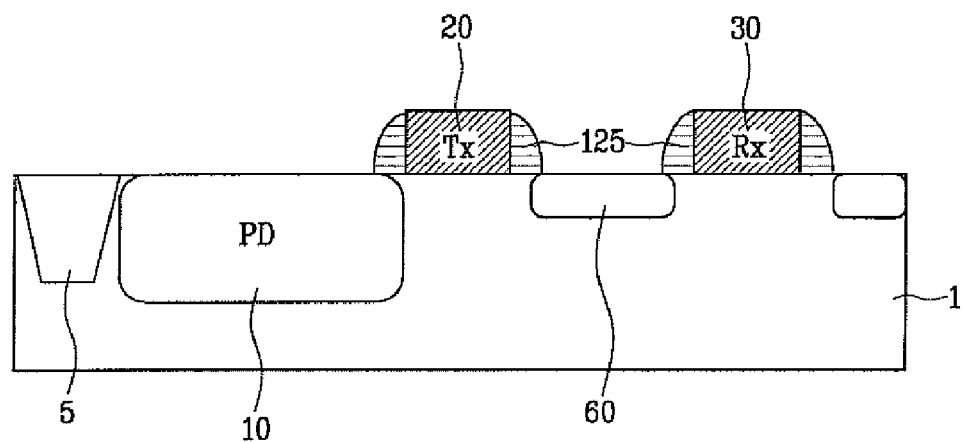
FIG. 3 is a sectional view illustrating the conventional 4T type CMOS image sensor.
Figure 4:
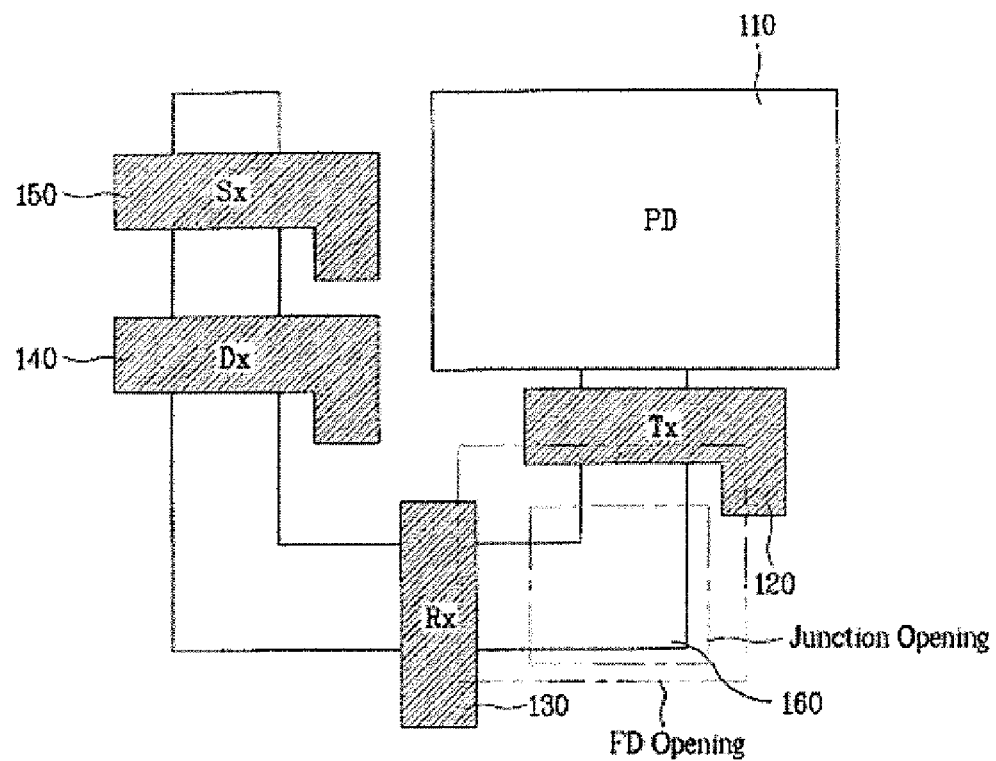
FIG. 4 is a layout view illustrating a unit pixel of a CMOS image sensor according to an embodiment of the present invention.
Figure 5:
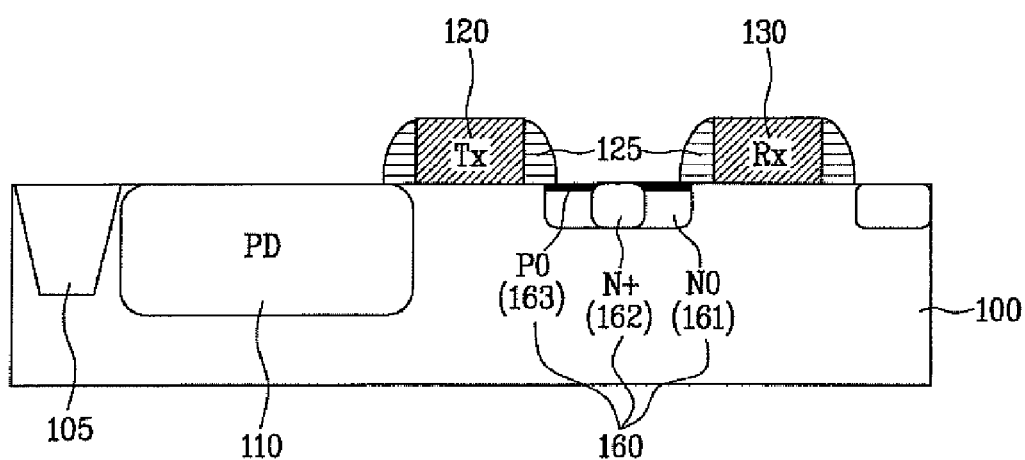
FIG. 5 is a sectional view illustrating a CMOS image sensor according to an embodiment of the present invention.

FIG. 4 is a layout view illustrating a unit pixel of a complementary metal oxide semiconductor (CMOS) image sensor according to an embodiment of the present invention, and FIG. 5 is a sectional view illustrating a CMOS image sensor according to an embodiment of the present invention.

As illustrated in FIGS. 4 and 5, a CMOS image sensor of the present invention can include a semiconductor substrate 100 having an isolation layer 105, a photodiode 110 formed at a predetermined portion of the semiconductor substrate 100, a plurality of gate polys 120 and 130 formed by the photodiode 110 at a predetermined interval, spacers 125 formed on sidewalls of the gate polys 120 and 130, a floating diffusion region 160 formed between the gate polys 120 and 130, and a floating diffusion node region 162 formed in the middle of the floating diffusion region 160.

In one embodiment, the floating diffusion region 160 can be formed by implantation of n type (or $n^0$ type) impurity ions (161) and the floating diffusion node region 162 can be formed by implantation of n+ type impurity ions. The floating diffusion node region 162 functions as an ohmic contact region.

The floating diffusion region 160 excluding the floating diffusion node region 162 can be implanted with p type impurity ions, thereby forming a p-type diffusion layer 163.

A method of manufacturing the CMOS image sensor, having a structure as described above, according to the present invention can be performed as follows.

First, a semiconductor substrate 100 in which an isolation region and an active region are defined can be prepared.

Here, the isolation region refers to a portion where a isolation layer 105 is formed, and the active region refers to the other portion.

In a specific embodiment, the semiconductor substrate 100 can include a p-well into which p type impurity ions are doped. The p-well region of the substrate is the semiconductor substrate 100 where subsequent implantations and other processes may be implemented as described below.

A plurality of gate polys 120 and 130 can be formed on a predetermined portion of the active region of the semiconductor substrate 100. Here, the gate polys 120 and 130 can be the gate polys of transistors Tx and Rx constituting the CMOS image sensor.

Subsequently, a photodiode 110 can be formed on the semiconductor substrate 100 so as to be adjacent to one 120 of the gate polys 120 and 130, as in FIG. 4. The photodiode 110 can be formed by implanting n type impurity ions to a predetermined depth, and then implanting p type impurity ions at the surface of the photodiode region.

Next, a nitride layer or an oxide layer can be formed on sidewalls of the gate polys 120 and 130, so that spacers 125 can be formed.

Then, using a first mask (including the floating diffusion (FD) opening of FIG. 4) that covers the photodiode 110 and exposes a region between the gate polys 120 and 130, $n^0$ type impurity ions can be implanted into the region exposed by the FD opening.

The $n^0$ type impurity region defined by the FD opening is the floating diffusion region 160 as described above.

The floating diffusion region 160 serves to receive electrons transferred from the photodiode 110.

Then, $p^0$ type impurity ions can be implanted into a surface of the floating diffusion region using the first mask. Thereby, a p type impurity region 163 is formed in the floating diffusion region 160. The implantation of the $n^0$ type impurity ions and the $p^0$ impurity ions can be a continuous process.

As can be seen in an embodiment of the present invention, the $n^0$ type impurity ions can be implanted using the first mask having the FD opening in common, and then the $p^0$ type impurity ions can be implanted.

The reason for forming the p type impurity region 163 is to eliminate crystal defects existing on the surface of the floating diffusion region 160, and thus reduce a leakage current.

Next, using a second mask (corresponding to the junction opening in FIG. 4) only exposing a part of the floating diffusion region 160, n+ type impurity ions can be implanted into the exposed part.

For convenience of description, the n+ type impurity ions formed in this way form the floating diffusion node region 162. The n+ type floating diffusion node region 162 formed using the second mask is a portion where a metal contact can be formed, and is preferably formed with a minimum area.

As described above, in the method of manufacturing a CMOS image sensor according to an embodiment of the present invention, the floating diffusion region 161 can be formed between the gate polys 120 and 130 using the first mask, and then the floating diffusion node region 162 can be formed using the second mask.

Therefore, in the present invention, a concentration of the impurities implanted into the floating diffusion region 161 can be independently controlled. Thus, a capacitance value of the floating diffusion region can also be independently controlled.

In this manner, by adjusting the impurity doping concentration in the floating diffusion region 161, a junction leakage current of the floating diffusion node region 162 can be reduced. As a result, a low-luminance characteristic of the CMOS image sensor is improved, and pixel variation is reduced.

As described above, the impurity implantation process for forming the floating diffusion node region is independently performed, so that the junction leakage current generated between the p type semiconductor substrate 100 and n+ type floating diffusion node region 162 can be controlled.

In general, an impurity concentration of the n type impurity region adjacent to the p type semiconductor substrate can be adjusted, which affects the electric field of a depletion region existing between the junctions. Therefore, the junction leakage current can be adjusted.

Typically, because the doping concentration of the p type semiconductor substrate is determined when the wafer is selected, the junction leakage current can be adjusted by adjusting the impurity concentration of the n type impurity region formed in the p type semiconductor substrate.

Meanwhile, in the case of embodiments of the present invention, after the $n^0$ type impurity ions for forming the floating diffusion region 160 are implanted, the $p^0$ type impurity ions can be implanted into the surface of a silicon substrate through a continuous ion implanting process. As a result, the leakage current caused by the crystal defects existing on the surface of the silicon substrate can be reduced. Therefore, the low-luminance characteristic of the CMOS image sensor can be improved.

In addition, as described above, the metal contact can be formed in the floating diffusion node region 162. It should be noted in the case of implanting the n+ type impurity ions to form the floating diffusion node region 162; there is a possibility of increasing the junction leakage current in the floating diffusion node region 162 due to an implant damage.

Therefore, the floating diffusion node region 162 is preferably formed with a minimum area. In other words, the junction opening of FIG. 4 exposed by the second mask is preferably formed with a minimum area.

As described above, the CMOS image sensor and method of manufacturing the same in accordance with embodiments of the present invention have the following effects.

First, after a masking process is performed once for the formation of the junction region of the logic section and independent doping of the floating diffusion node region of the unit pixel, p type and n type doping can be performed continuously on the floating diffusion node region.

Second, the p type and n type doping concentrations can be adjusted through a multi-implant process of the floating diffusion node region using the mask for forming the floating diffusion region, apart from the formation of the junction region of the logic section, so that a process of reducing the junction leakage current of the floating diffusion region is made possible.

Third, when the mask for forming the junction region of the logic section is open, only the contact forming portion of the floating diffusion node region is open with a minimum area at the same time. Thereby, the implant damage to the floating diffusion node region is minimized, and thus the junction leakage current can be reduced.

Therefore, the low-luminance characteristic of the CMOS image sensor can be improved.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method of manufacturing a complementary metal oxide semiconductor (CMOS) image sensor, comprising:
   providing a semiconductor substrate having an isolation layer formed thereon;
   forming a photodiode on an active region of the semiconductor substrate;
   forming first and second gate polys on a transistor region of the active region of the semiconductor substrate;
   forming a floating diffusion region on the semiconductor substrate between the first and second gate polys for receiving electrons transferred from the photodiode; and
   forming a floating diffusion node region at part of the floating diffusion region for forming a metal contact,
   wherein forming the floating diffusion region comprises implanting n type impurity ions in the active region using a first mask covering the photodiode and exposing a region between the first and second gate polys.

2. The method according to claim 1, wherein:
   the first gate poly is a gate poly of a transfer transistor of a CMOS image sensor; and
   the second gate poly is a gate poly of a reset transistor of the CMOS sensor.

3. The method according to claim 1, wherein forming the floating diffusion region further comprises implanting p tYpe impurity ions into a surface of the floating diffusion region after implanting the n type impurity ions.

4. The method according to claim 3, wherein forming the floating diffusion node region comprises implanting n+ type impurity ions to a higher density than impurities implanted into the floating diffusion region.

5. The method according to claim 1, wherein forming the floating diffusion node region comprises implanting p type impurity ions into a surface of the floating diffusion region using the first mask.

6. The method according to claim 5, wherein forming the floating diffusion node region further comprises implanting n+type impurity using a second mask exposing only the part of the floating diffusion region for forming the metal contact.

7. A method of manufacturing a complementary metal oxide semiconductor (CMOS) image sensor, comprising:
   providing a semiconductor substrate having an isolation region and an active region defined thereon;
   forming a plurality of gate polys at a predetermined portion of the active region: forming a photodiode on the semiconductor substrate at one side of one of the plurality of gate polys;
   forming spacers on sidewalls of the gate polys;
   implanting $n^0$ type impurity ions for defining a floating diffusion region in the active region using a first mask covering the photodiode and exposing a region between two of the plurality of gate polys;
   implanting $p^0$ type impurity ions into a surface of the floating diffusion region using the first mask; and
   implanting n+type impurity ions for forming a the floating diffusion node region for a metal contact at a part of the floating diffusion region using a second mask exposing only the part of the floating diffusion region.

* * * * *